United States Patent
Fujimori et al.

(10) Patent No.: US 9,231,162 B2
(45) Date of Patent: Jan. 5, 2016

(54) LIGHT-EMITTING ELEMENT

(71) Applicant: ROHM CO., LTD., Kyoto (JP)

(72) Inventors: Takao Fujimori, Kyoto (JP); Yasuo Nakanishi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/147,639

(22) Filed: Jan. 6, 2014

(65) Prior Publication Data

US 2014/0131737 A1 May 15, 2014

Related U.S. Application Data

(63) Continuation of application No. 13/350,013, filed on Jan. 13, 2012, now Pat. No. 8,653,551.

(30) Foreign Application Priority Data

Jan. 14, 2011 (JP) ................................ 2011-006065

(51) Int. Cl.
*H01L 33/00* (2010.01)
*H01L 33/40* (2010.01)
*H01L 33/42* (2010.01)
*H01L 33/38* (2010.01)

(52) U.S. Cl.
CPC .............. *H01L 33/405* (2013.01); *H01L 33/42* (2013.01); *H01L 33/38* (2013.01)

(58) Field of Classification Search
USPC ........ 257/98, 99, 79, 101, 102, 103, E33.067, 257/E33.068; 438/22, 29
See application file for complete search history.

(56) References Cited

U.S. PATENT DOCUMENTS

| 2005/0211989 | A1 | 9/2005 | Horio et al. | |
|---|---|---|---|---|
| 2006/0081869 | A1* | 4/2006 | Lu et al. | 257/99 |
| 2008/0093617 | A1* | 4/2008 | Song et al. | 257/98 |
| 2008/0121903 | A1* | 5/2008 | Hiramatsu et al. | 257/89 |
| 2011/0018024 | A1 | 1/2011 | Fukshima et al. | |
| 2012/0012884 | A1* | 1/2012 | Muramoto et al. | 257/99 |
| 2012/0032144 | A1 | 2/2012 | Fudeta | |
| 2013/0126937 | A1 | 5/2013 | Muramoto et al. | |

FOREIGN PATENT DOCUMENTS

| JP | 2005-302747 | 10/2005 |
|---|---|---|
| JP | 2006-121084 | 5/2006 |

(Continued)

*Primary Examiner* — Robert Bachner
(74) *Attorney, Agent, or Firm* — Rabin & Berdo, P.C.

(57) ABSTRACT

A light-emitting element, a light-emitting element unit and a light-emitting element package are provided, which are each reduced in reflection loss and intra-film light absorption by suppressing multiple light reflection in a transparent electrode layer and hence have higher luminance. The light-emitting element 1 includes a substrate 2, an n-type nitride semiconductor layer 3, a light-emitting layer 4, a p-type nitride semiconductor layer 5, a transparent electrode layer 6 and a reflective electrode layer 7, and the transparent electrode layer 6 has a thickness T satisfying the following expression (1):

$$\frac{3\lambda}{4n} + 0.30 \times \left(\frac{\lambda}{4n}\right) \le T \le \frac{3\lambda}{4n} + 0.45 \times \left(\frac{\lambda}{4n}\right) \quad (1)$$

wherein λ is the light-emitting wavelength of the light-emitting element 4, and n is the refractive index of the transparent electrode layer 6.

22 Claims, 11 Drawing Sheets

(56) References Cited

FOREIGN PATENT DOCUMENTS

| | | |
|---|---|---|
| JP | 2006-245156 | 9/2006 |
| JP | 2008-103674 | 5/2008 |
| JP | 2008-153634 | 7/2008 |
| JP | 2008-263130 | 10/2008 |
| JP | 2009-260316 | 11/2009 |
| JP | 2010-40761 | 2/2010 |
| JP | 2010-153565 | 7/2010 |
| WO | WO 2010/073883 * | 7/2010 |

* cited by examiner

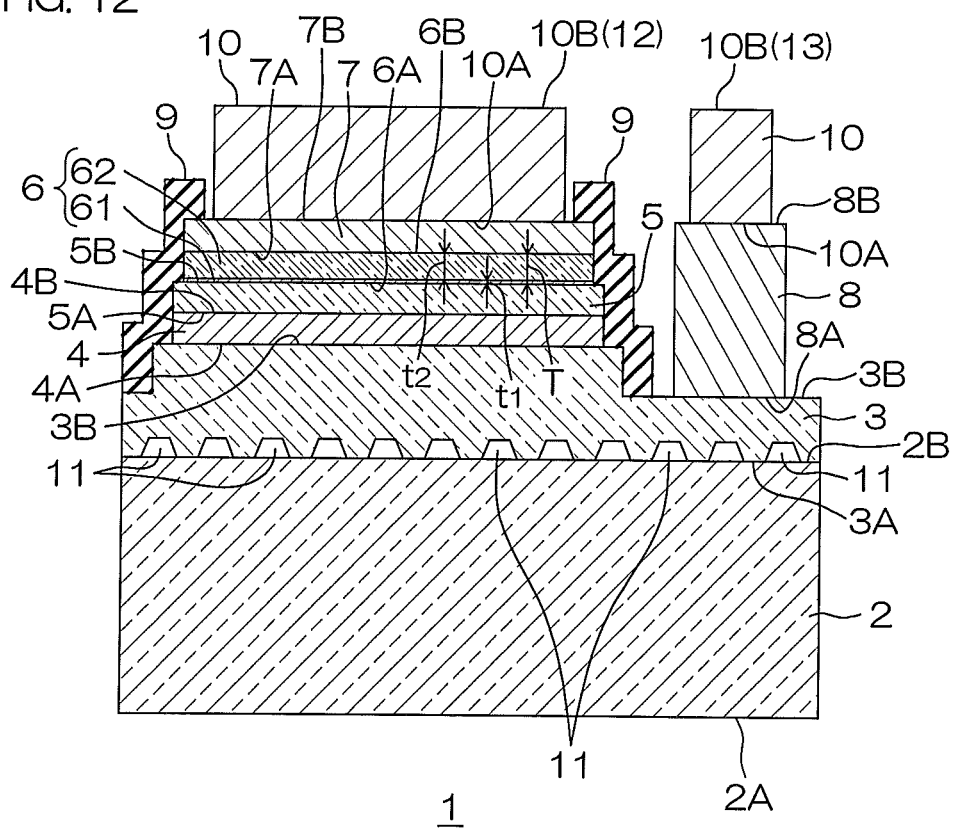

LIGHT-EMITTING ELEMENT

This is a Continuation of U.S. application Ser. No. 13/350,013, filed on Jan. 13, 2012, and allowed on Oct. 4, 2013, the subject matter of which is incorporated herein by reference.

BACKGROUND OF THE INVENTION

1. Field of the Invention

The present invention relates to a light-emitting element, a light-emitting element unit including the light-emitting element, and a light-emitting element package including the light-emitting element unit and a resin package encapsulating the light-emitting element unit.

2. Description of the Related Art

One of prior-art semiconductor light-emitting elements is disclosed, for example, in JP-2008-263130A.

A semiconductor light-emitting element disclosed in FIG. 4 of JP-2008-263130A includes a sapphire substrate through which light is extracted, a light-emitting layer, a transparent electrode and a reflective metal layer.

When the light-emitting layer emits light, the light is mostly extracted through the sapphire substrate, but partly passes through the transparent electrode to be reflected on the reflective metal layer, and further passes through the transparent electrode to be extracted through the sapphire substrate.

In the prior-art semiconductor light-emitting element, therefore, the light emitted from the light-emitting layer is extracted at a lower light extracting efficiency, making it difficult to provide a sufficient luminance.

SUMMARY OF THE INVENTION

It is therefore a principal object of the present invention to provide a light-emitting element having a higher luminance.

According to the present invention, there is provided a light-emitting element having a front surface and a back surface and adapted to extract light from the back surface with the front surface facing down, the light-emitting element including: a substrate transparent to a light-emitting wavelength $\lambda$ and defining the back surface; an n-type nitride semiconductor layer provided on the substrate; a light-emitting layer which is provided on the n-type nitride semiconductor layer and emits light at the light-emitting wavelength $\lambda$; a p-type nitride semiconductor layer provided on the light-emitting layer; a transparent electrode layer which is provided on the p-type nitride semiconductor layer and is transparent to the light-emitting wavelength $\lambda$ of the light-emitting layer; and a reflective electrode layer which is provided on the transparent electrode layer and reflects light passing through the transparent electrode layer toward the back surface; wherein the transparent electrode layer has a thickness T satisfying the following expression (1):

$$\frac{3\lambda}{4n} + 0.30 \times \left(\frac{\lambda}{4n}\right) \leq T \leq \frac{3\lambda}{4n} + 0.45 \times \left(\frac{\lambda}{4n}\right) \quad (1)$$

wherein $\lambda$ is the light-emitting wavelength of the light-emitting element, and n is the refractive index of the transparent electrode layer.

The term "light-emitting wavelength $\lambda$" means the peak wavelength of the spectrum of the light emitted from the light-emitting layer. The expression "transparent to the light-emitting wavelength $\lambda$" means that the transmittance at the light-emitting wavelength $\lambda$ is, for example, not less than 60%.

It is generally considered that, if the thickness of the transparent electrode layer is equal to an integer multiple of $\lambda/4n$ (wherein $\lambda$ is the light-emitting wavelength and n is the refractive index of the transparent electrode layer), the reflectance of an interface between the transparent electrode layer and the p-type nitride semiconductor layer can be reduced. Therefore, it is a conventional practice to optically design the transparent electrode layer so that the thickness thereof is equal to an integer multiple of $\lambda/4n$. The design is based on a precondition that the light reflected on the reflective electrode layer includes only a perpendicular light component that is incident perpendicularly on the transparent electrode layer.

In reality, however, the light reflected on the reflective electrode layer includes not only the perpendicular light component but also an oblique light component that is incident obliquely on the transparent electrode layer. Therefore, even if the transparent electrode layer is designed to have a thickness equal to an integer multiple of $\lambda/4n$, the oblique light component is reflected on the interface between the transparent electrode layer and the p-type nitride semiconductor layer, and the reflected light is further reflected in the transparent electrode layer multiple times. That is, there is a limitation in improving the light extracting efficiency simply by designing the transparent electrode layer so that the thickness of the transparent electrode layer is equal to an integer multiple of $\lambda/4n$.

According to the present invention, the thickness T of the transparent electrode layer satisfies the above expression (1). Therefore, the reflection of the light on the interface between the transparent electrode layer and the p-type nitride semiconductor layer can be reduced as compared with the case in which the transparent electrode layer is designed to have a thickness equal to an integer multiple of $\lambda/4n$. As a result, multiple light reflection in the transparent electrode layer can be reduced to improve the light extracting efficiency. Thus, the light-emitting element has a higher luminance.

The transparent electrode layer preferably includes a first electrode sublayer provided on the p-type nitride semiconductor layer in contact with the p-type nitride semiconductor layer and having a first thickness $t_1$, and a second electrode sublayer provided on the first electrode sublayer and having a second thickness $t_2$ that is greater than the first thickness $t_1$.

The transparent electrode layer is formed, for example, by depositing an electrode material imparted with a predetermined level of energy on the p-type nitride semiconductor layer. Therefore, an excessively high energy level is disadvantageous, because the p-type nitride semiconductor layer is likely to be significantly damaged.

The damage to the p-type nitride semiconductor layer can be reduced by depositing an electrode material at a lower energy level to form the first electrode sublayer in contact with the p-type nitride semiconductor layer. If the transparent electrode layer included only the first electrode sublayer formed by the deposition at the lower energy level, however, the transparent electrode layer would have a poorer quality with a lower density. Therefore, the first electrode sublayer is first formed as having a smaller thickness $t_1$ and then the second electrode sublayer is formed as having a thickness $t_2$ by depositing an electrode material at a higher energy level to adjust the overall thickness T of the transparent electrode layer, whereby the quality of the entire transparent electrode layer can be improved.

The first electrode sublayer and the second electrode sublayer may have different light absorbances.

The transparent electrode layer preferably comprises ITO or ZnO. The light-emitting wavelength λ is preferably 450 nm.

The reflective electrode layer preferably comprises an alloy comprising silver, a platinum group metal and copper, and is preferably provided on the transparent electrode layer in contact with the transparent electrode layer.

The interface between the transparent electrode layer and the reflective electrode layer of the alloy comprising silver, the platinum group metal and copper has a proper light reflecting ability, which is comparable to that of an interface between the reflective electrode layer and an insulative layer which may be provided between the transparent electrode layer and the reflective electrode layer.

Since the reflective electrode layer is provided on the transparent electrode layer in contact with the transparent electrode layer, heat generated by the emission of the light from the light-emitting layer is conducted directly to the reflective electrode layer from the transparent electrode layer to be thereby efficiently released from the reflective electrode layer to the outside of the light-emitting element.

This improves the heat releasing efficiency and the light extracting efficiency.

The reflective electrode layer is preferably provided in the same pattern as the transparent electrode layer on the transparent electrode layer, and a surface of the reflective electrode layer opposed to the transparent electrode layer is preferably entirely kept in contact with the transparent electrode layer.

With this arrangement, the reflective electrode layer, the transparent electrode layer and contact portions of these layers completely overlap each other as seen in a stacking direction (in a substrate thicknesswise direction) in which these layers are stacked. That is, the reflective electrode layer and the transparent electrode layer have no non-overlapping portions and, therefore, are free from irregularities which may otherwise occur due to the non-overlapping portions.

Thus, the light emitted from the light-emitting layer and passing through the transparent electrode layer can be reliably incident on the interface between the transparent electrode layer and the reflective electrode layer, and efficiently reflected on the interface. The reflective electrode layer and the transparent electrode layer have the same size as seen in the stacking direction, so that the interface (reflective surface) between the transparent electrode layer and the reflective electrode layer has the greatest possible size. Thus, the light passing through the transparent electrode layer can be efficiently reflected on the interface. This further improves the light extracting efficiency.

In the absence of the irregularities described above, a connection surface of the light-emitting element to be connected to an external wiring element is flat, and a connection area between the light-emitting element and the wiring element can be increased. This further improves the efficiency of heat release from the light-emitting element to the wiring element.

In the light-emitting element, no insulative layer is preferably provided between the transparent electrode layer and the reflective electrode layer.

According to this arrangement, the reflective electrode layer of the alloy permits proper light reflection on the interface between the reflective electrode layer and the transparent electrode layer even without the provision of the insulative layer. In the absence of the insulative layer, reduction in heat releasing efficiency and light extracting efficiency can be prevented which may otherwise occur due to the insulative layer.

The platinum group metal is preferably platinum or palladium. The substrate preferably comprises sapphire, GaN or SiC.

The substrate preferably has a plurality of projections provided on a contact surface thereof kept in contact with the n-type nitride semiconductor layer.

With this arrangement, light traveling from the n-type nitride semiconductor layer toward the substrate is substantially prevented from being reflected on the contact surface toward the n-type nitride semiconductor layer. This correspondingly improves the light extracting efficiency.

The projections are preferably discretely arranged. In this case, the projections may be arranged in a matrix array, or may be arranged in staggered relation.

The light-emitting layer preferably comprises In.

The light-emitting element preferably further includes a connection layer comprising silver, solder or AuSn and provided on the reflective electrode layer. This makes it possible to provide a light-emitting element unit which includes the light-emitting element and a wiring element connected to the connection layer to apply a voltage from the wiring element to the light-emitting element.

The light-emitting element preferably further includes an n-type electrode layer which connects the wiring element to the n-type nitride semiconductor layer. With this arrangement, the light is emitted from the light-emitting layer by applying the voltage between the n-type electrode layer and the reflective electrode layer.

The light-emitting element preferably further includes an isolation insulative layer which isolates and insulates the n-type electrode layer and the reflective electrode layer from each other.

A light-emitting element package is also provided, which includes the light-emitting element unit and a resin package encapsulating the light-emitting element unit.

BRIEF DESCRIPTION OF THE DRAWINGS

FIG. 12 is a diagram showing a variation of the light-emitting element shown in FIG. 1.

DETAILED DESCRIPTION OF PREFERRED EMBODIMENTS

An embodiment of the present invention will hereinafter be described in detail with reference to the attached drawings.

Figure 1:
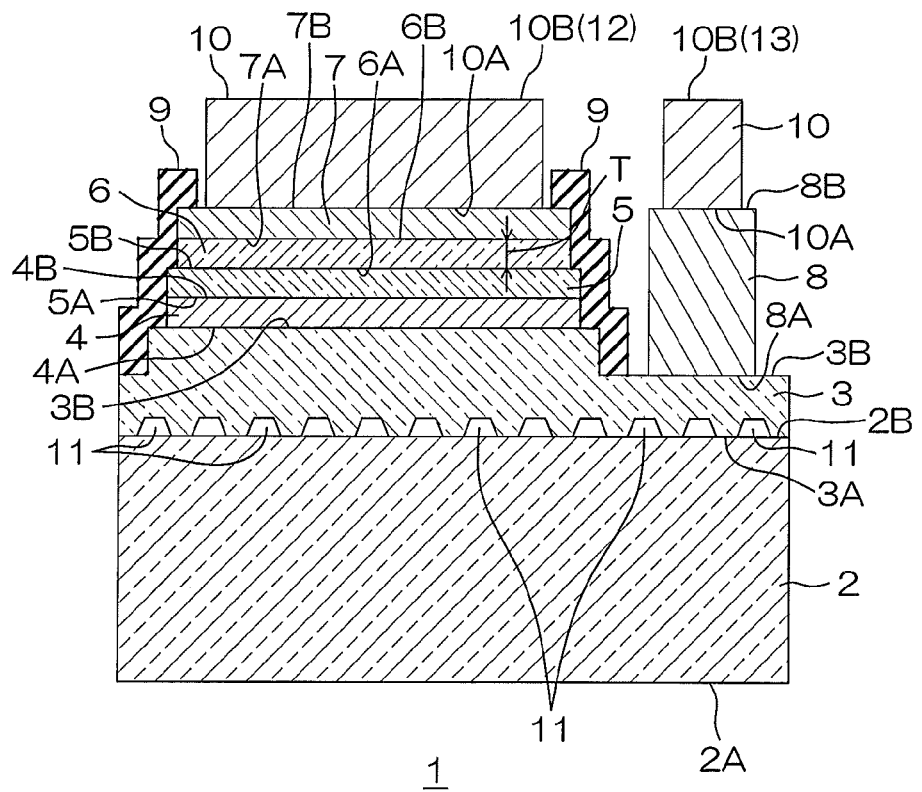
FIG. 1 is a schematic sectional view of a light-emitting element according to one embodiment of the present invention.
Figure 2:
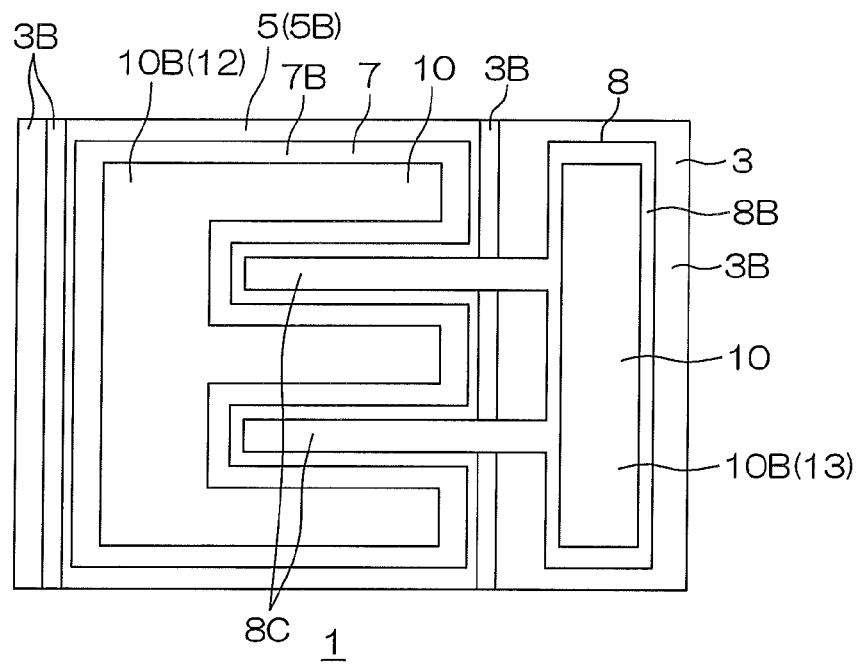
FIG. 2 is a schematic plan view of the light-emitting element.
Figure 3:
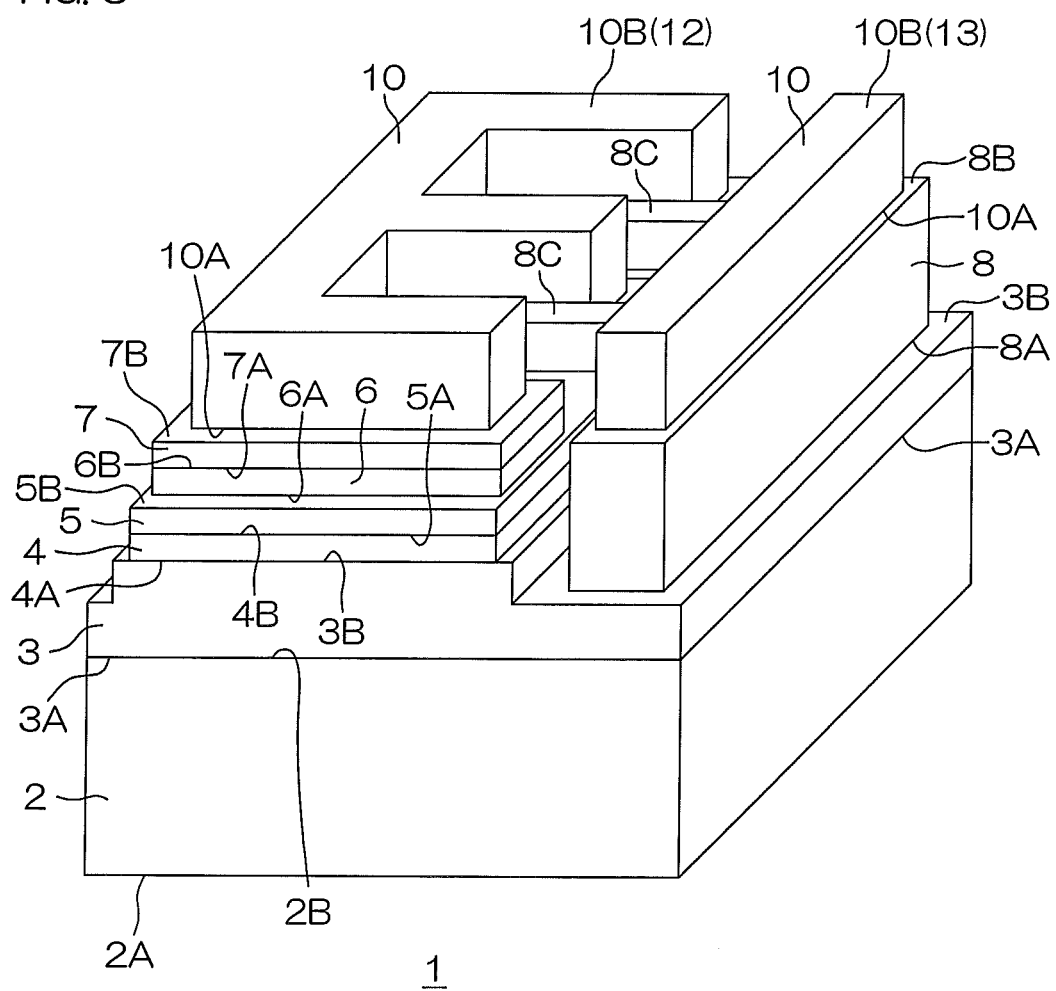
FIG. 3 is a schematic perspective view of the light-emitting element.

FIG. 1 is a schematic sectional view of a light-emitting element according to one embodiment of the present invention. FIG. 2 is a schematic plan view of the light-emitting element. FIG. 3 is a schematic perspective view of the light-emitting element.

The light-emitting element 1 includes a substrate 2, an n-type nitride semiconductor layer 3, a light-emitting layer 4, a p-type nitride semiconductor layer 5, a transparent electrode layer 6, a reflective electrode layer 7, an n-type electrode layer 8, an isolation insulative layer 9 and connection layers 10.

The n-type nitride semiconductor layer 3, the light-emitting layer 4, the p-type nitride semiconductor layer 5, the transparent electrode layer 6, the reflective electrode layer 7, the n-type electrode layer 8, the isolation insulative layer 9 and the connection layers 10 are provided on the substrate 2.

The substrate 2 is made of a material (e.g., sapphire, GaN or SiC) transparent to a light-emitting wavelength λ (e.g., 450 nm) of the light-emitting layer 4 at which light is emitted from the light-emitting layer 4. The substrate 2 has a thickness of, for example, 400 μm. The substrate 2 has a back surface 2A defined by a lower surface thereof in FIG. 1, and a front surface 2B defined by an upper surface thereof in FIG. 1. The back surface 2A serves as a light extracting surface from which the light is extracted, and defines a back surface of the light-emitting element 1. The front surface 2B serves as a contact surface of the substrate 2 kept in contact with the n-type nitride semiconductor layer 3.

The n-type nitride semiconductor layer 3 is provided on the substrate 2. The n-type nitride semiconductor layer 3 covers the entire front surface 2B of the substrate 2. The n-type nitride semiconductor layer 3 is made of n-type GaN, and is transparent to the light-emitting wavelength λ of the light-emitting layer 4. The n-type nitride semiconductor layer 3 has a back surface 3A defined by a lower surface thereof covering the front surface 2B of the substrate 2 in FIG. 1, and a front surface 3B defined by an upper surface thereof opposite from the back surface 3A in FIG. 1. A left portion of the front surface 3B in FIG. 1 projects, so that the front surface 3B has a step.

The light-emitting layer 4 is provided on the n-type nitride semiconductor layer 3. The light-emitting layer 4 is formed by a dry etching method. The light-emitting layer 4 covers the left projecting portion of the front surface 3B of the n-type nitride semiconductor layer 3 in FIG. 1. The light-emitting layer 4 is made of an In-containing nitride semiconductor (e.g., InGaN). The light-emitting layer 4 has a back surface 4A defined by a lower surface thereof covering the left portion of the front surface 3B of the n-type nitride semiconductor layer 3 in FIG. 1, and a front surface 4B defined by an upper surface thereof opposite from the back surface 4A in FIG. 1.

The p-type nitride semiconductor layer 5 is provided on the light-emitting layer 4. The p-type nitride semiconductor layer 5 covers the entire front surface 4B of the light-emitting layer 4. The p-type nitride semiconductor layer 5 is formed together with the light-emitting layer 4 by the dry etching method. The p-type nitride semiconductor layer 5 is made of p-type GaN, and is transparent to the light-emitting wavelength λ of the light-emitting layer 4. The total thickness of the n-type nitride semiconductor layer 3, the light-emitting layer 4 and the p-type nitride semiconductor layer 5 is, for example, 6.5 μm at a maximum. The p-type nitride semiconductor layer 5 has a back surface 5A defined by a lower surface thereof covering the front surface 4B of the light-emitting layer 4 in FIG. 1, and a front surface 5B defined by an upper surface thereof opposite from the back surface 5A in FIG. 1.

The transparent electrode layer 6 is provided on the p-type nitride semiconductor layer 5. The transparent electrode layer 6 covers substantially the entire front surface 5B of the p-type nitride semiconductor layer 5. The transparent electrode layer 6 is formed, for example, by a lift-off method. The transparent electrode layer 6 is made of ZnO (zinc oxide) or ITO (indium tin oxide), and is transparent to the light-emitting wavelength λ of the light-emitting layer 4. In this embodiment, the transparent electrode layer 6 is made of ITO. The transparent electrode layer 6 has a thickness T which satisfies the following expression (1):

$$\frac{3\lambda}{4n} + 0.30 \times \left(\frac{\lambda}{4n}\right) \leq T \leq \frac{3\lambda}{4n} + 0.45 \times \left(\frac{\lambda}{4n}\right) \quad (1)$$

wherein λ is the light-emitting wavelength of the light-emitting layer 4, and n is the refractive index of the transparent electrode layer 6.

For example, ITO has a refractive index n of 2.0 and, where the light-emitting wavelength λ of the light-emitting layer 4 is 450 nm, the thickness T of the transparent electrode layer 6 is about 1850 Å to about 1950 Å.

The transparent electrode layer 6 has a back surface 6A defined by a lower surface thereof covering the front surface 5B of the p-type nitride semiconductor layer 5 in FIG. 1, and a front surface 6B defined by an upper surface thereof opposite from the back surface 6A in FIG. 1.

The reflective electrode layer 7 is provided in the same pattern as the transparent electrode layer 6 on the transparent electrode layer 6. The reflective electrode layer 7 covers the entire front surface 6B of the transparent electrode layer 6 so as not to protrude from the front surface 6B in FIG. 1. The reflective electrode layer 7 has a back surface 7A defined by a lower surface thereof covering the front surface 6B of the transparent electrode layer 6 in FIG. 1, and a front surface 7B defined by an upper surface thereof opposite from the back surface 7A. The back surface 7A of the reflective electrode layer 7 serves as an opposed surface which is opposed to the front surface 6B of the transparent electrode layer 6, and is entirely kept in contact (surface contact) with the front surface 6B of the transparent electrode layer 6. Therefore, nothing (e.g., no insulative layer) is present between the transparent electrode layer 6 and the reflective electrode layer 7.

In this embodiment, the reflective electrode layer 7 is made of an alloy containing silver, a platinum group metal and copper. Usable examples of the platinum group metal include platinum and palladium. The proportions of silver, the platinum group metal and copper in the alloy are about 98%, about 1% and about 1%, respectively. The reflective electrode layer 7 typically has a thickness of, for example, 50 nm to 500 nm, preferably 350 nm.

The n-type electrode layer 8 is provided on a right portion of the front surface 3B of the n-type nitride semiconductor layer 3 in FIG. 1. The n-type electrode layer 8 is provided on a portion of the front surface 3B of the n-type nitride semiconductor layer 3 which is recessed toward the rear surface 3A to form the step described above. The n-type electrode layer 8 is made of Al and Cr. In this embodiment, the n-type electrode layer 8 is formed by forming an Al sublayer in contact with the n-type nitride semiconductor layer 3 and then forming a Cr sublayer on the Al sublayer. The n-type electrode layer 8 has a thickness of, for example, about 26000 Å. The n-type electrode layer 8 has a back surface 8A defined by a surface thereof in contact with the front surface 3B of the n-type nitride semiconductor layer 3 in FIG. 1, and a front surface 8B defined by a surface thereof opposite from the back surface 8A.

Side surfaces of the n-type nitride semiconductor layer 3, the light-emitting layer 4, the p-type nitride semiconductor layer 5, the transparent electrode layer and the reflective electrode layer 7 are covered with the isolation insulative layer 9 which is made of, for example, $SiO_2$. Thus, the light-emitting layer 4, the p-type nitride semiconductor layer 5, the transparent electrode layer 6 and the reflective electrode layer 7 are isolated and insulated from the n-type electrode layer 8. Sin, AlN, $Al_2O_3$ or SiON may be used instead of $SiO_2$ as a material for the isolation insulative layer 9. The isolation insulative layer 9 has a thickness of 500 Å to 50000 Å, for example, 1000 Å. In FIGS. 2 and 3, the isolation insulative layer 9 is not shown.

The connection layers 10 are respectively provided on the reflective electrode layer 7 and the n-type electrode layer 8. The connection layers 10 each comprise, for example, Ag, Ti or Pt, or an alloy of any of these metals. The connection layers 10 may each comprise solder or AuSn. The connection layers 10 may each include a Pt sublayer for suppression of diffusion of the connection layer materials from the connection layers 10 to the reflective electrode layer 7 and the n-type electrode layer 8. In this embodiment, the connection layers 10 each include a Ti sublayer, a Pt sublayer and an AuSn sublayer stacked in this order from the reflective electrode layer 7 and the n-type electrode layer 8. The connection layers 10 each have a back surface 10A defined by a lower surface thereof in contact with the reflective electrode layer 7 or the n-type electrode layer 8 in FIG. 1, and a front surface 10B defined by an upper surface thereof opposite from the back surface 10A in FIG. 1. The front surfaces 10B of the connection layers 10 serve as a front surface of the light-emitting element 1.

The front surface 10B of the connection layer 10 contacting the reflective electrode layer 7 serves as a p-type electrode portion 12, and the front surface 10B of the connection layer 10 contacting the n-type electrode layer 8 serves as an n-type electrode portion 13. The p-type electrode portion 12 and the n-type electrode portion 13 respectively have flat surfaces, which are located at the same height level to be flush with each other (also see FIG. 3). Since the reflective electrode layer 7 and the n-type electrode layer 8 are isolated and insulated from each other by the isolation insulative layer 9 as described above, the p-type electrode portion 12 of the connection layer 10 on the reflective electrode layer 7 and the n-type electrode portion 13 of the connection layer 10 on the n-type electrode layer 8 are isolated and insulated from each other by the isolation insulative layer 9.

As seen in plan, the p-type nitride semiconductor layer 5, the transparent electrode layer 6, the reflective electrode layer 7 and the p-type electrode portion 12 of the connection layer 10 each have, for example, a generally E-shape, and the n-type electrode layer 8 and the n-type electrode portion 13 of the connection layer 10 each have a generally I-shape (see FIG. 2). The n-type electrode layer 8 has two extension portions 8C which respectively extend into two spaces defined by the E-shapes of the p-type nitride semiconductor layer 5, the transparent electrode layer 6, the reflective electrode layer 7 and the connection layer 10 (p-type electrode portion 12) (see FIGS. 2 and 3).

When a forward voltage is applied between the p-type electrode portion 12 and the n-type electrode portion 13, the light is emitted from the light-emitting layer 4 at a light-emitting wavelength λ of 440 nm to 460 nm in the light-emitting element 1. The light passes through the n-type nitride semiconductor layer 3 and the substrate 2 in this order to be extracted from the back surface 2A of the substrate 2. Light traveling from the light-emitting layer 4 toward the p-type nitride semiconductor layer 5 passes through the p-type nitride semiconductor layer 5 and the transparent electrode layer 6 in this order to be reflected on an interface between the transparent electrode layer 6 and the reflective electrode layer 7. The reflected light passes through the transparent electrode layer 6, the p-type nitride semiconductor layer 5, the light-emitting layer 4, the n-type nitride semiconductor layer 3 and the substrate 2 in this order to be extracted from the back surface 2A of the substrate 2.

A plurality of projections 11 are provided on the front surface 2B of the substrate 2 as projecting toward the n-type nitride semiconductor layer 3.

Figure 4A:
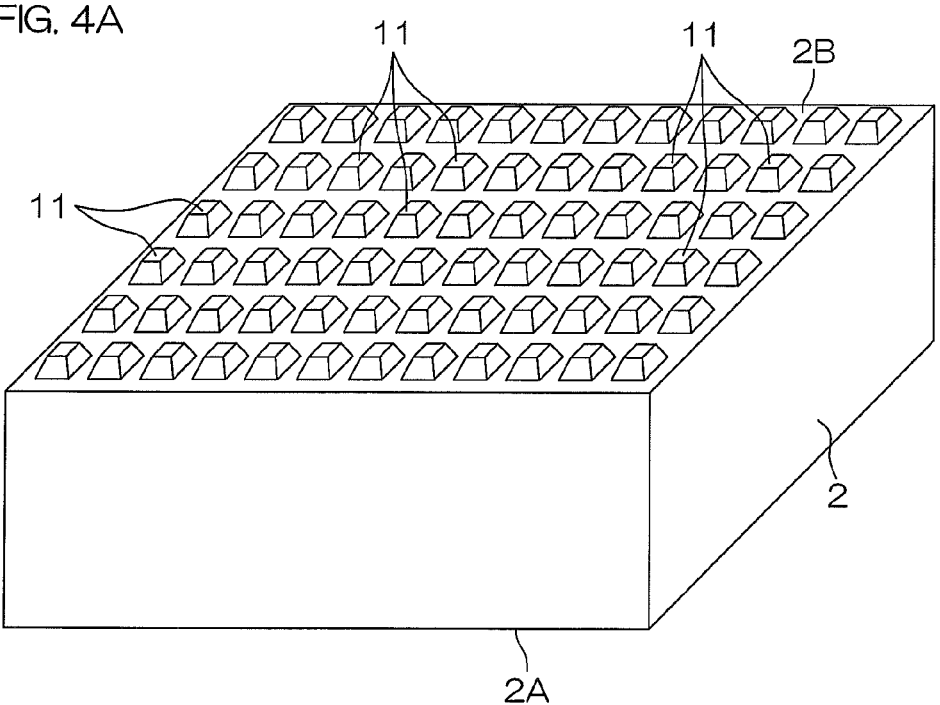
FIG. 4A is a schematic perspective view showing an exemplary structure of a substrate.
Figure 4B:
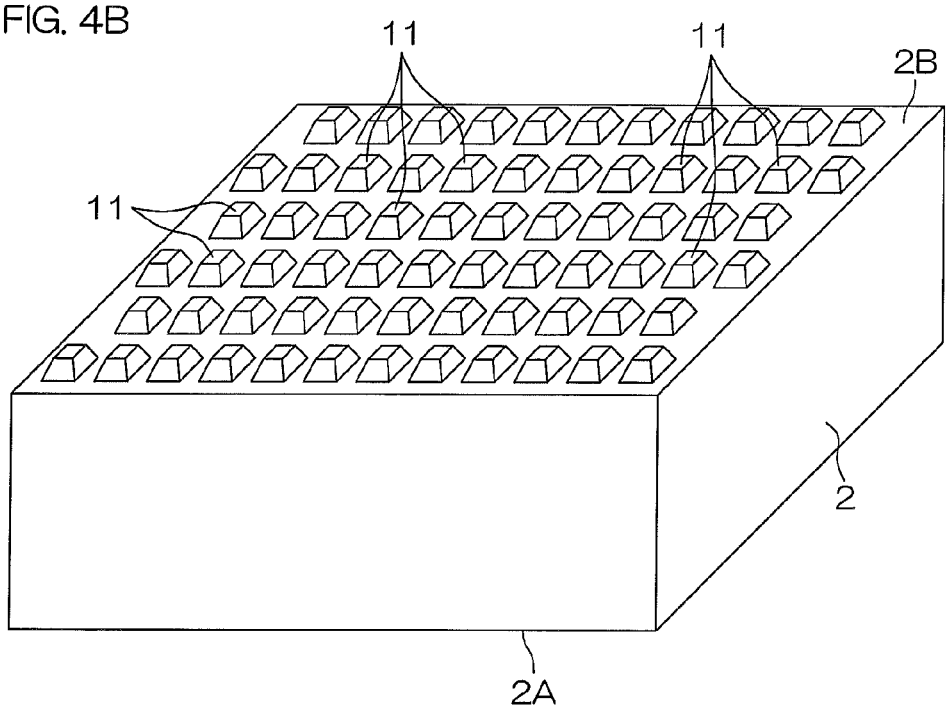
FIG. 4B is a schematic perspective view showing another exemplary structure of the substrate.

FIGS. 4A and 4B are schematic perspective views showing exemplary structures of the substrate.

The projections 11 are discretely arranged. More specifically, the projections 11 may be spaced from each other to be arranged in a matrix array (see FIG. 4A), or may be arranged in staggered relation (see FIG. 4B). The projections 11 are each made of SiN.

With the provision of the projections 11 of SiN, light rays incident at different angles are substantially prevented from being totally reflected on the front surface 2B of the substrate 2. Thus, light rays traveling from the n-type nitride semiconductor layer 3 toward the substrate 2 are substantially prevented from being reflected on the interface between the n-type nitride semiconductor layer 3 and the substrate 2 toward the n-type nitride semiconductor layer 3. This improves the light extracting efficiency.

FIGS. 5A to 5H are schematic sectional views showing a method of producing the light-emitting element shown in FIG. 1.

Figure 5A:
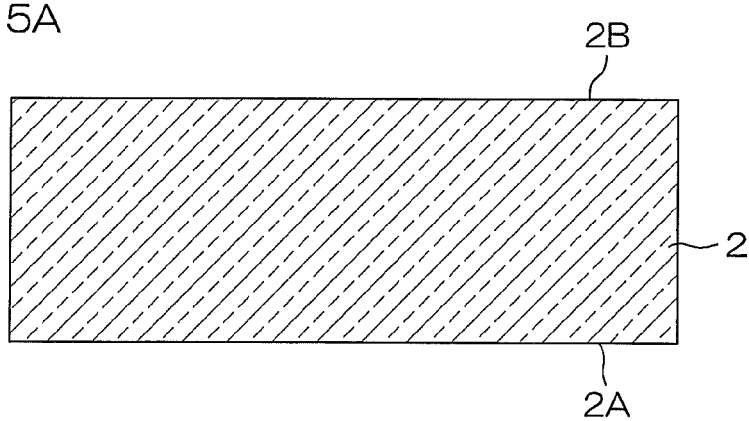
FIG. 5A is a schematic sectional view showing a method of producing the light-emitting element shown in FIG. 1.

First, a substrate 2 is prepared as shown in FIG. 5A.

Figure 5B:
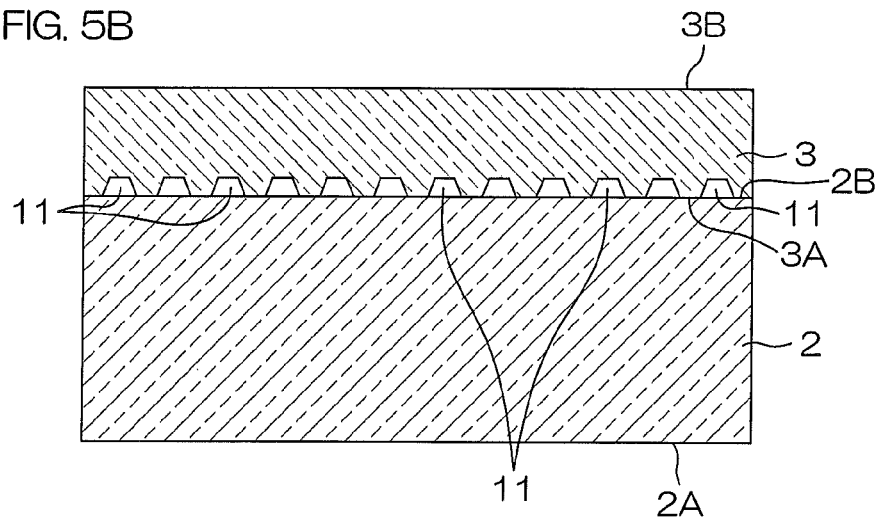
FIG. 5B is a schematic sectional view showing a step subsequent to the step shown in FIG. 5A.

Then, a layer of SiN (SiN layer) is formed on a front surface 2B of the substrate 2. The SiN layer is etched with the use of a resist pattern (not shown) as a mask to be thereby divided into a plurality of projections 11 as shown in FIG. 5B.

In turn, a layer of n-type GaN (n-GaN layer) is formed over the front surface 2B of the substrate 2. The n-GaN layer serves as an n-type nitride semiconductor layer 3 on the substrate 2, and covers all the projections 11.

Figure 5C:
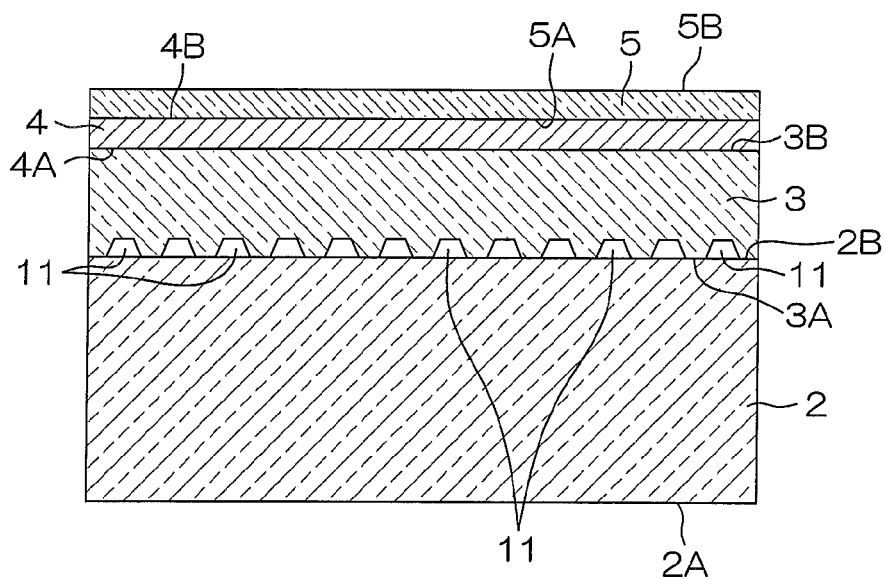
FIG. 5C is a schematic sectional view showing a step subsequent to the step shown in FIG. 5B.

Subsequently, as shown in FIG. 5C, an In-containing nitride semiconductor layer (e.g., $In_xGa_{1-x}N$ layer) is formed on a front surface 3B of the n-type nitride semiconductor layer 3. This layer serves as a light-emitting layer 4 on the n-type nitride semiconductor layer 3. The light-emitting wavelength λ of the light-emitting layer 4 is adjusted to 440 nm to 460 nm by controlling the composition ratio of In and Ga.

Then, a layer of p-type GaN (p-GaN layer) is formed as a p-type nitride semiconductor layer 5 on a front surface 4B of the light-emitting layer 4. A p-AlGaN layer containing Al or a layered structure including a p-GaN sublayer and a p-Al-GaN sublayer may be employed as the p-type nitride semiconductor layer 5.

Figure 5D:
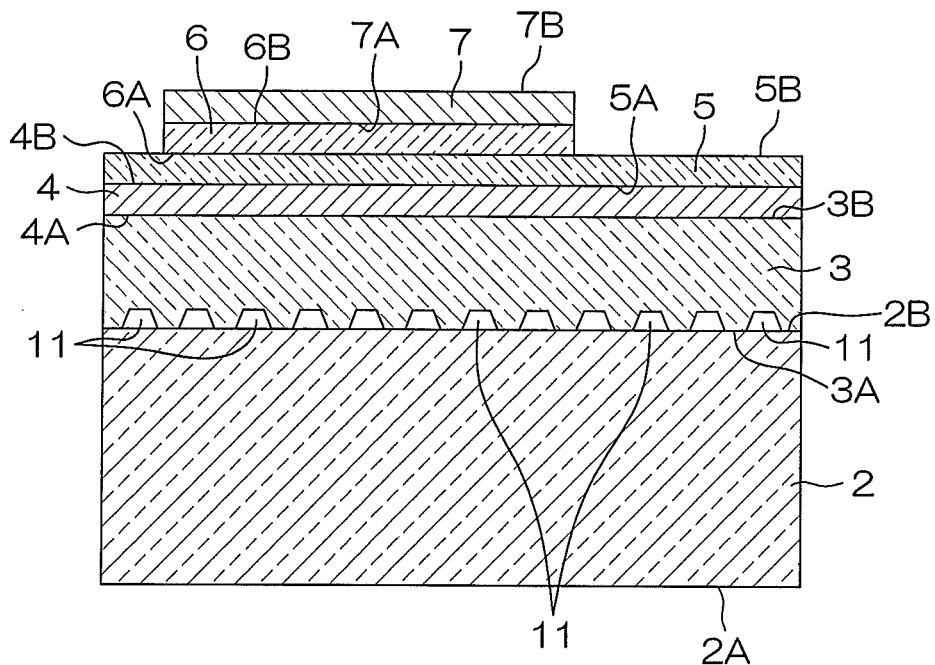
FIG. 5D is a schematic sectional view showing a step subsequent to the step shown in FIG. 5C.

In turn, a resist pattern (not shown) having an opening in a region to be formed with a transparent electrode layer 6 is formed on the p-type nitride semiconductor layer 5. Subsequently, an ITO material is deposited on the p-type nitride semiconductor layer 5 via the resist pattern, for example, by a sputtering method. Then, an unnecessary portion of the ITO material is lifted off together with the resist pattern. Thus, a layer of ITO (ITO layer) is formed on a selected portion of a front surface 5B of the p-type nitride semiconductor layer 5 as shown in FIG. 5D. The ITO layer serves as a transparent electrode layer 6. In the formation of the transparent electrode layer 6, a heat treatment may be performed to improve electrical connection and adhesion between the p-type nitride semiconductor layer 5 and the transparent electrode layer 6. In this case, the heat treatment is performed, for example, at a temperature of 500° C. to 700° C.

Subsequently, a layer of an alloy containing silver, a platinum group metal and copper (alloy layer) is formed over the front surface 6B of the transparent electrode layer 6 and the front surface 5B of the p-type nitride semiconductor layer 5, and etched with the use of a resist pattern (not shown) as a mask, whereby a reflective electrode layer 7 is formed in the same pattern as the transparent electrode layer 6 on the transparent electrode layer 6 as shown in FIG. 5D.

Figure 5E:
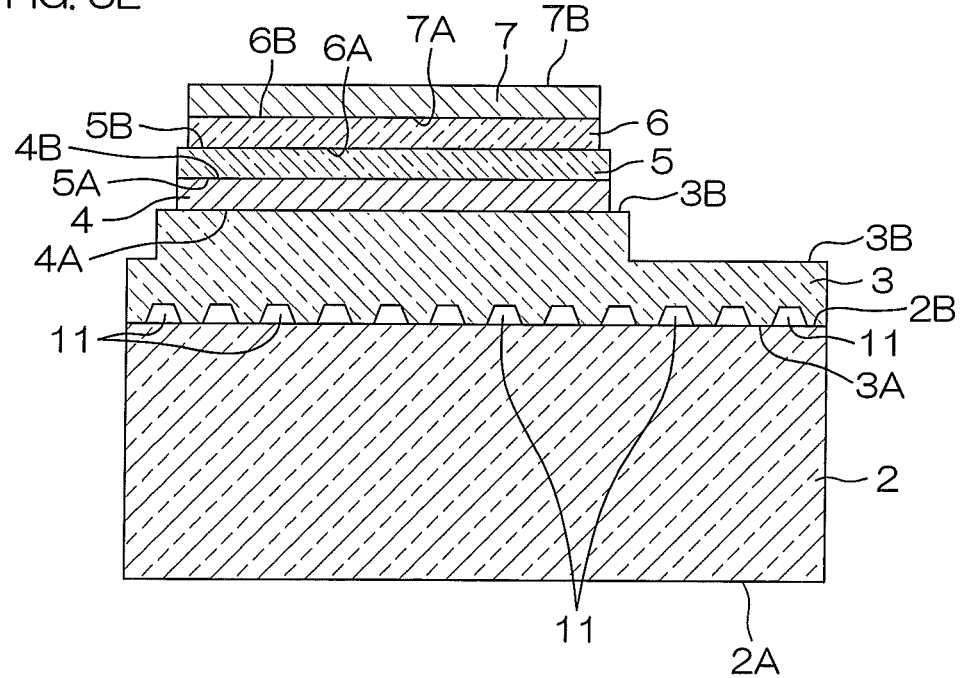
FIG. 5E is a schematic sectional view showing a step subsequent to the step shown in FIG. 5D.

Then, parts of the p-type nitride semiconductor layer 5, the light-emitting layer 4 and the n-type nitride semiconductor layer 3 are selectively etched off as shown in FIG. 5E with the use of a resist pattern (not shown) as a mask.

Figure 5F:
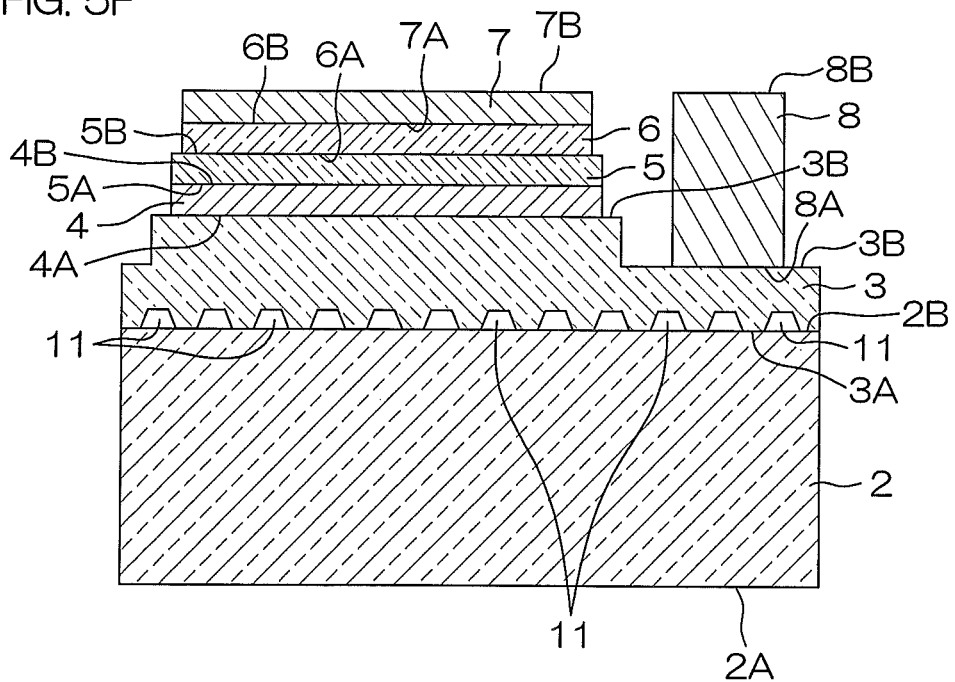
FIG. 5F is a schematic sectional view showing a step subsequent to the step shown in FIG. 5E.

In turn, as shown in FIG. 5F, an n-type electrode layer 8 is formed on the front surface 3B of the n-type nitride semiconductor layer 3 by a lift-off method using a resist pattern (not shown). The n-type electrode layer 8 may be made of Al, or may have a layered structure including a Ti sublayer and an Al sublayer. In the formation of the n-type electrode layer 8, a heat treatment may be performed for improvement of adhesion and electrical connection between the n-type electrode layer 8 and the n-type nitride semiconductor layer 3.

Figure 5G:
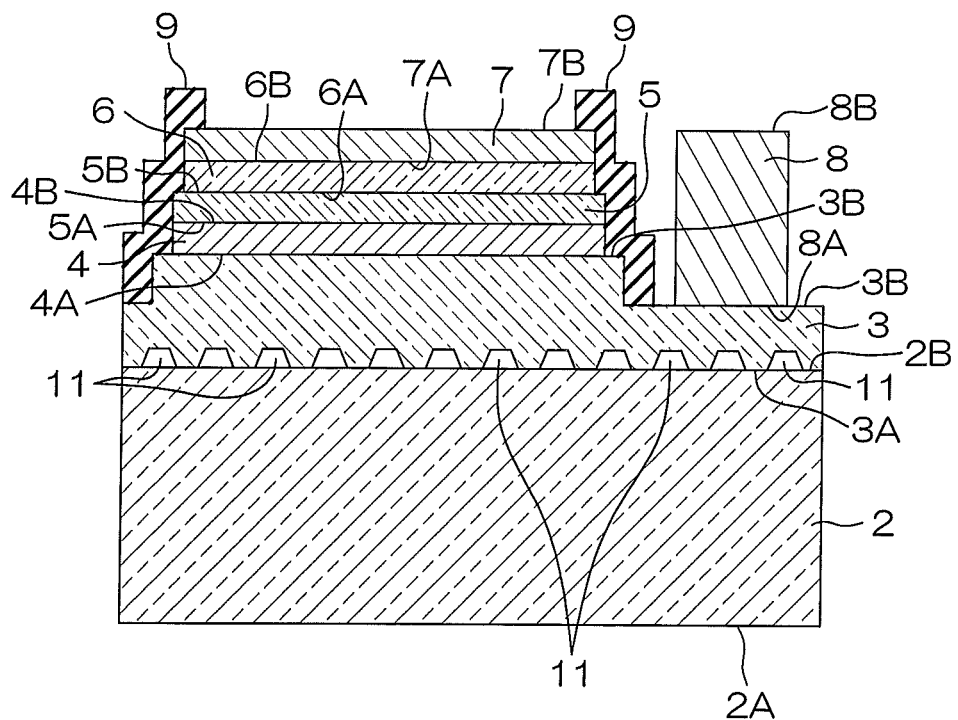
FIG. 5G is a schematic sectional view showing a step subsequent to the step shown in FIG. 5F.

Subsequently, as shown in FIG. 5G, an isolation insulative layer 9 of $SiO_2$ is formed. The isolation insulative layer 9 is formed so as to cover a part of the front surface 3B of the n-type nitride semiconductor layer 3 to be located adjacent a p-type electrode portion 12 (see FIG. 1), side surfaces of the light-emitting layer 4, the p-type nitride semiconductor layer 5, the transparent electrode layer 6 and the reflective electrode layer 7, and a part of a front surface 7B of the reflective electrode layer 7. The formation of the isolation insulative layer 9 is achieved by a lift-off method using a resist pattern (not shown) or an etch-off method. SiN, AlN, $Al_2O_3$ or SiON may be used instead of $SiO_2$ as the material for the isolation insulative layer 9.

Then, connection layers 10 are formed on the front surface 7B of the reflective electrode layer 7 and the front surface 8B of the n-type electrode layer 8 by a lift-off method using a resist pattern (not shown). In this embodiment, the connection layers 10 each include a sublayer of AuSn (AuSn sublayer). The connection layers 10 each further include a Pt sublayer for protection of the reflective electrode layer 7 and the n-type electrode layer 8 from diffusion of AuSn from the AuSn sublayers. The connection layers 10 each further include a Ti sublayer for improvement adhesion between the connection layer 10 and the reflective electrode layer 7 and between the connection layer 10 and the n-type electrode layer 8. In this embodiment, therefore, the Ti sublayer, the Pt sublayer and the AuSn sublayer are stacked in this order on each of the reflective electrode layer 7 and the n-type electrode layer 8 to form the connection layer 10.

A structure shown in FIG. 1 is formed by the process sequence described above.

In practice, the process sequence described above with reference to FIGS. 5A to 5G is performed as a semiconductor wafer process for forming a plurality of light-emitting elements 1 each having the structure shown in FIG. 1 on a wafer. After this process, the thickness of the wafer is adjusted to, for example, 300 µm by a grinding/polishing process. Then, the wafer is divided into the plurality of light-emitting elements 1 (chips) by an element isolating process (scribing/breaking process).

Figure 6:
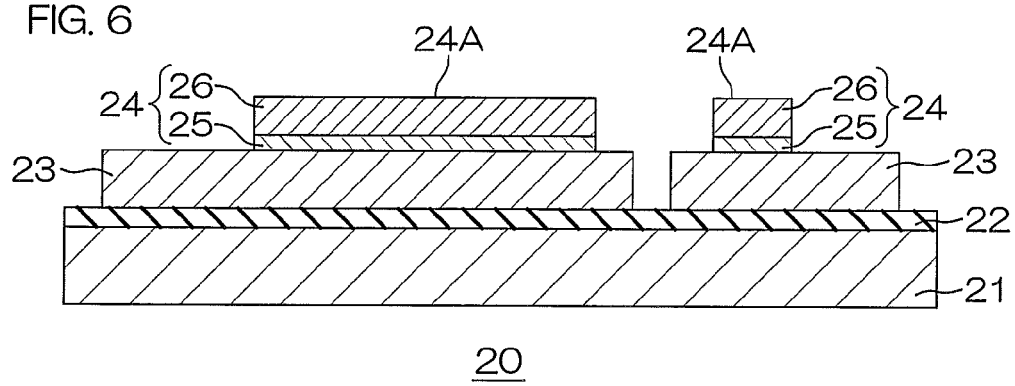
FIG. 6 is a schematic sectional view of a wiring element.

FIG. 6 is a schematic sectional view of a wiring element. The light-emitting element 1 is connected to the wiring element 20 via the connection layers 10 thereof.

Referring to FIG. 6, the wiring element 20 includes a base substrate 21, an insulative layer 22, electrode layers 23 and connection layers 24.

The base substrate 21 is made of, for example, Si, and has a thickness of, for example, 130 µm. The insulative layer 22 is made of, for example, $SiO_2$, and covers the entire front surface (upper surface in FIG. 6) of the base substrate 21. The insulative layer 22 has a thickness of, for example, 1000 Å. A back surface (lower surface in FIG. 6) of the base substrate 21 defines a back surface of the wiring element 20.

The electrode layers 23 are made of, for example, Al, and each have a thickness of, for example, 25000 Å. Two electrode layers 23 are provided in two positions on the insulative layer 22 in laterally spaced relation in FIG. 6.

The connection layers 24 are respectively provided on the electrode layers 23. The connection layers 24 each have a double layered structure including a Ti sublayer 25 provided closer to the base substrate 21 and an Au sublayer 26 provided on the Ti sublayer 25. The Ti sublayer 25 is made of Ti, and has a thickness of, for example, 1000 Å. The Au sublayer 26 is made of Au, and has a thickness of, for example, 10000 Å. The connection layers 24 each have a front surface 24A defined by a surface (upper surface in FIG. 6) thereof opposite from a surface contacting the electrode layer 23. The front surfaces 24A of the connection layers 24 are flat, and define a front surface of the wiring element 20.

Figure 7:
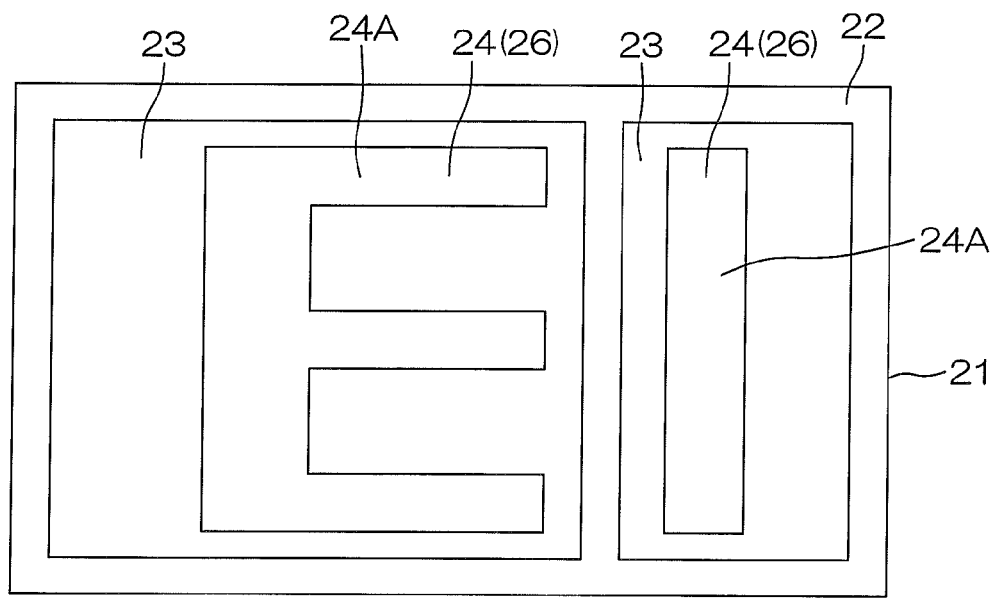
FIG. 7 is a schematic plan view of the wiring element.

FIG. 7 is a schematic plan view of the wiring element.

As seen in plan in FIG. 7, the connection layers 24 include a generally E-shaped connection layer conformal to the p-type electrode portion 12 and a generally I-shaped connection layer conformal to the n-type electrode portion 13 in combination (also see FIG. 2).

Figure 8:
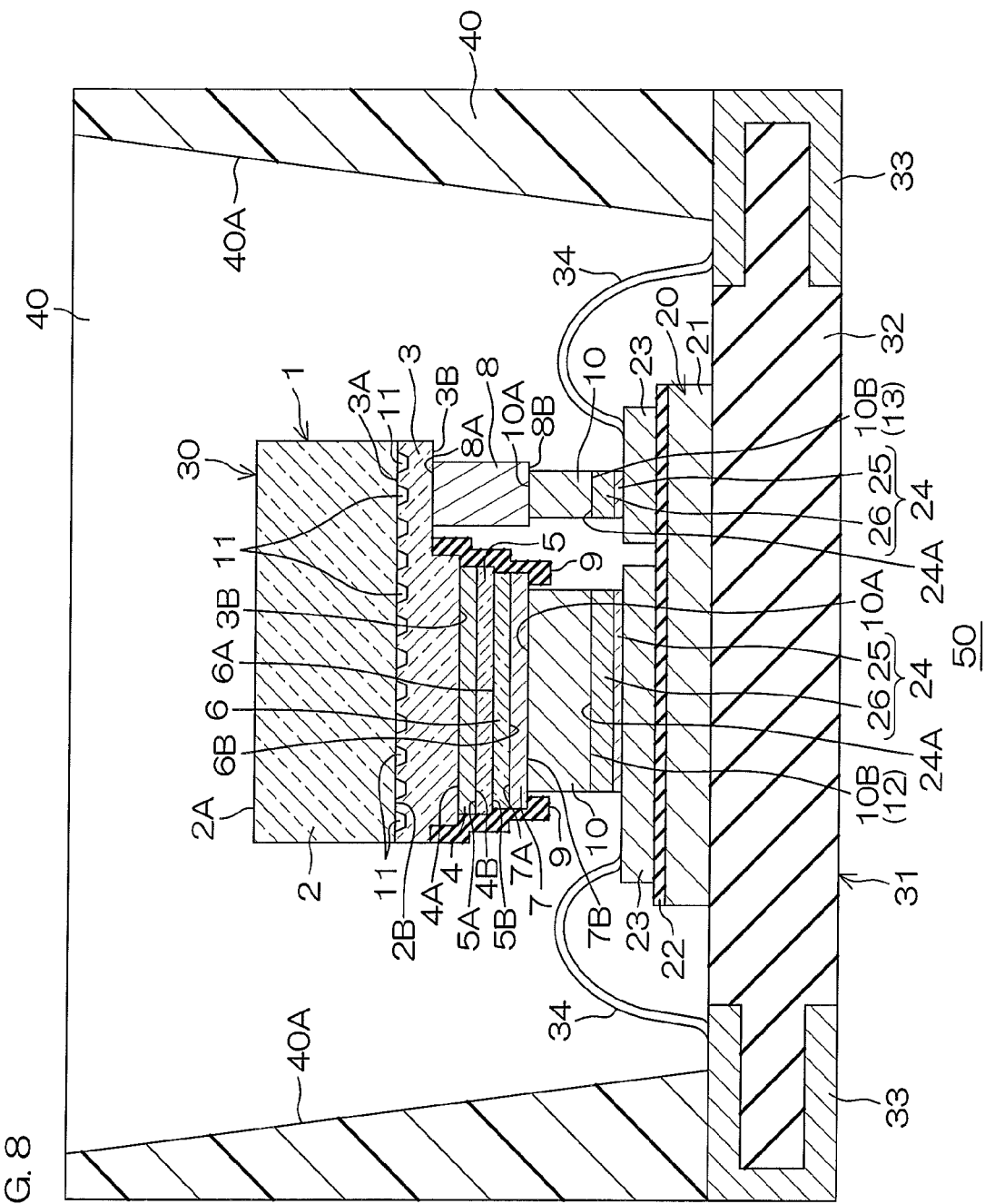
FIG. 8 is a schematic sectional view of a light-emitting element package.
Figure 9:
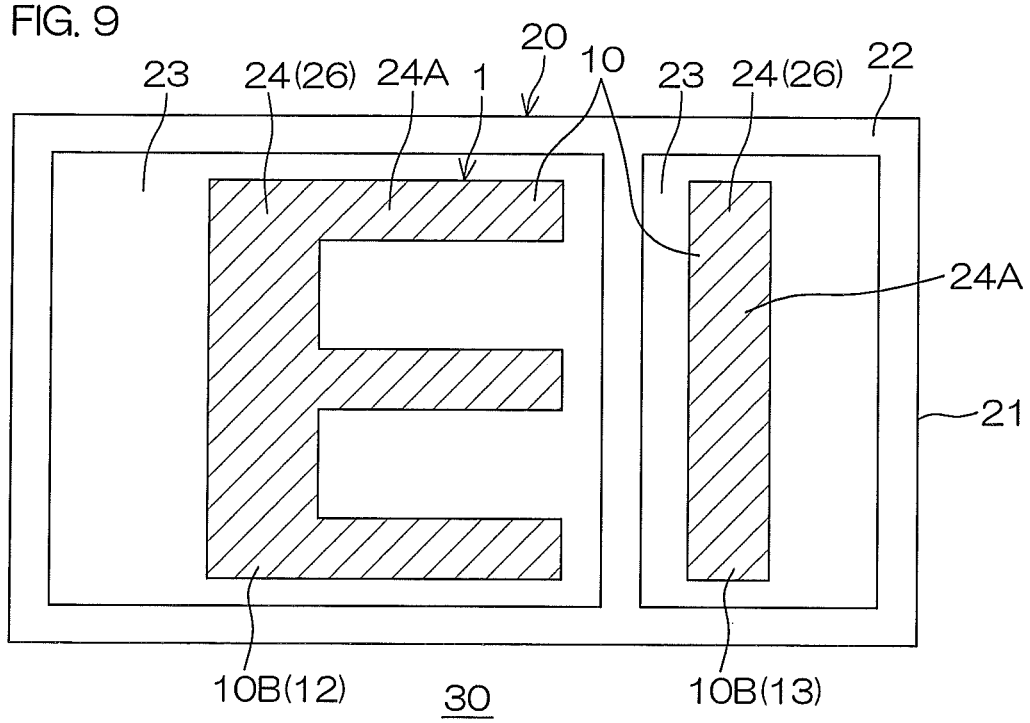
FIG. 9 is a schematic plan view of the wiring element, illustrating the connection state of the wiring element and the light-emitting element.
Figure 10:
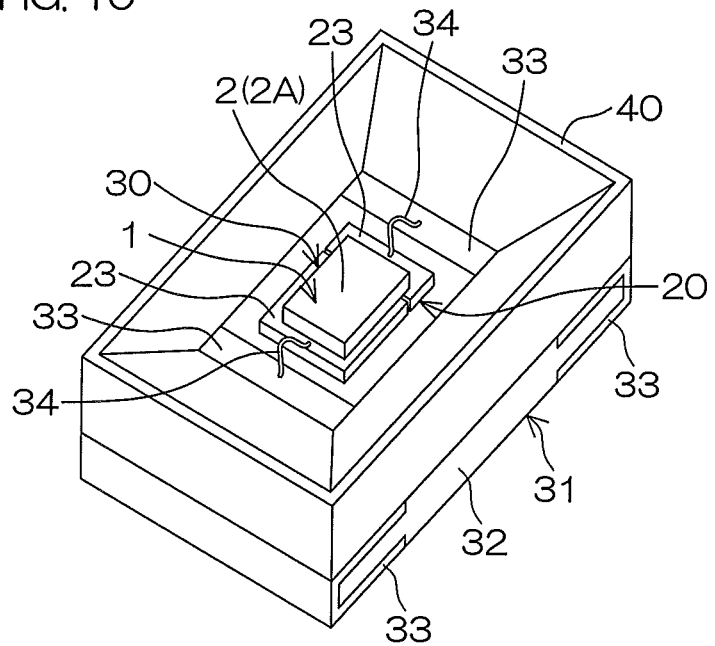
FIG. 10 is a schematic perspective view of the light-emitting element package.

FIG. 8 is a schematic sectional view of a light-emitting element package. FIG. 9 is a schematic plan view of the wiring element, illustrating the connection state of the wiring element and the light-emitting element. FIG. 10 is a schematic perspective view of the light-emitting element package. The light-emitting package 50 includes the light-emitting element unit 30, a support board 31 and a resin package 40.

As shown in FIG. 6, the wiring element 20 is placed with the front surfaces 24A of the connection layers 24 thereof facing up. The light-emitting element 1 shown in FIG. 1 is held with the front surfaces 10B (the p-type electrode portion 12 and the n-type electrode portion 13) of the connection layers 10 thereof facing down (in an attitude turned upside down from that shown in FIG. 1), and brought into opposed relation to the wiring element 20 assuming an attitude of FIG. 6 from the above.

By moving the light-emitting element 1 toward the wiring element 20, the front surfaces 10B of the connection layers 10 are brought into surface contact with the front surfaces 24A of the connection layers 24 as shown in FIG. 8. More specifically, the p-type electrode portion 12 and the n-type electrode portion 13 of the connection layers are brought into surface contact with the front surfaces 24A of the left connection layer 24 and the right connection layer 24, respectively, in FIG. 8. In this state, a heat treatment process is performed to bond the connection layers 10 to the connection layers 24, respectively, by fusion and solidification. As a result, the light-emitting element 1 and the wiring element 20 are combined together to provide the light-emitting element unit 30.

In the completed light-emitting element unit 30, the front surfaces 10B of the connection layers 10 are respectively laid on and bonded to the front surfaces 24A of the connection layers 24 as indicated by hatching in FIG. 9. The front surfaces 10B of the connection layers 10 and the front surfaces 24A of the connection layers 24 are flat and flush with each other and, therefore, have no portion uninvolved in the bonding. Thus, the entire front surfaces 10B of the connection layers 10 are respectively bonded to the entire front surfaces 24A of the connection layers 24. The connection layers 10 are also electrically connected to the connection layers 24, respectively, by the bonding.

Referring to FIG. 8, the light-emitting element unit 30 is connected to the support board 31. The support board 31 includes an insulative substrate 32 supporting the light-emitting element unit 30, and a pair of metal leads 33 exposed along opposite edges of the insulative substrate 32 for electrical connection between the light-emitting element 1 and an external element.

Where the light-emitting element unit 30 assumes a reference attitude as shown in FIG. 8, the substrate 2 of the light-emitting element 1 is located at the uppermost position, and the base substrate 21 of the wiring element 20 is located at the lowermost position. In this state, the base substrate 21 is bonded to the insulative substrate 32 from the above. Then, the electrode layer 23 (left electrode layer 23 in FIG. 8) on which the connection layer 24 connected to the p-type electrode portion 12 is provided is connected to one of the leads 33 located adjacent this electrode layer 23 via a bonding wire 34. Further, the electrode layer 23 (right electrode layer 23 in FIG. 8) on which the connection layer 24 connected to the n-type electrode portion 13 is provided is connected to the other lead 33 located adjacent this electrode layer 23 via a bonding wire 34.

The resin package 40 is a case filled with a resin. The light-emitting element unit 30 is accommodated (or encapsulated) in the resin package 40 for protection thereof and, in this state, fixed to the support board 31. The resin package 40 has a reflective portion 40A on its side wall (opposed to the light-emitting element unit 30) to reflect light emitted from the light-emitting element 1 of the light-emitting element unit 30 for extraction of the light.

The resin of the resin package 40 may contain a fluorescent material and a reflective material. Where the light-emitting element 1 emits blue light, for example, a yellow fluorescent material is added to the resin to cause the light-emitting element package 50 to emit white light. A multiplicity of such light-emitting element packages 50 may be combined together for use as an lighting device such as an electric lamp, a back light for a liquid crystal TV and a head lamp for a motor vehicle.

The light-emitting element package according to the present invention is not limited in structure to the light-emitting element package 50, but may be constructed such that the light-emitting element unit 30 is connected to a pair of lead frames respectively electrically connected to the p-type electrode portion 12 and the n-type electrode portion 13 of the light-emitting element unit 30 by a flip bonding method.

In the light-emitting element 1, as described above, the light emitted from the light-emitting layer 4 mostly passes through the n-type nitride semiconductor layer 3 to be extracted from the substrate 2, but partly passes through the p-type nitride semiconductor layer 5 and the transparent electrode layer 6 to be reflected on the interface between the transparent electrode layer 6 and the reflective electrode layer 7 and then extracted from the substrate 2.

Since the thickness T of the transparent electrode layer 6 of the light-emitting element 1 satisfies the above expression (1), the light reflection on the interface between the transparent electrode layer 6 and the p-type nitride semiconductor layer 5 and on the interface between the transparent electrode layer 6 and the reflective electrode layer 7 can be reduced as compared with the case in which the transparent electrode layer 6 is designed to have a thickness T equal to an integer multiple of $\lambda/4n$. As a result, multiple light reflection in the transparent electrode layer 6 is suppressed to improve the light extracting efficiency. This increases the luminance of the light-emitting element 1. More specifically, this is explained with reference to FIG. 11.

Figure 11:
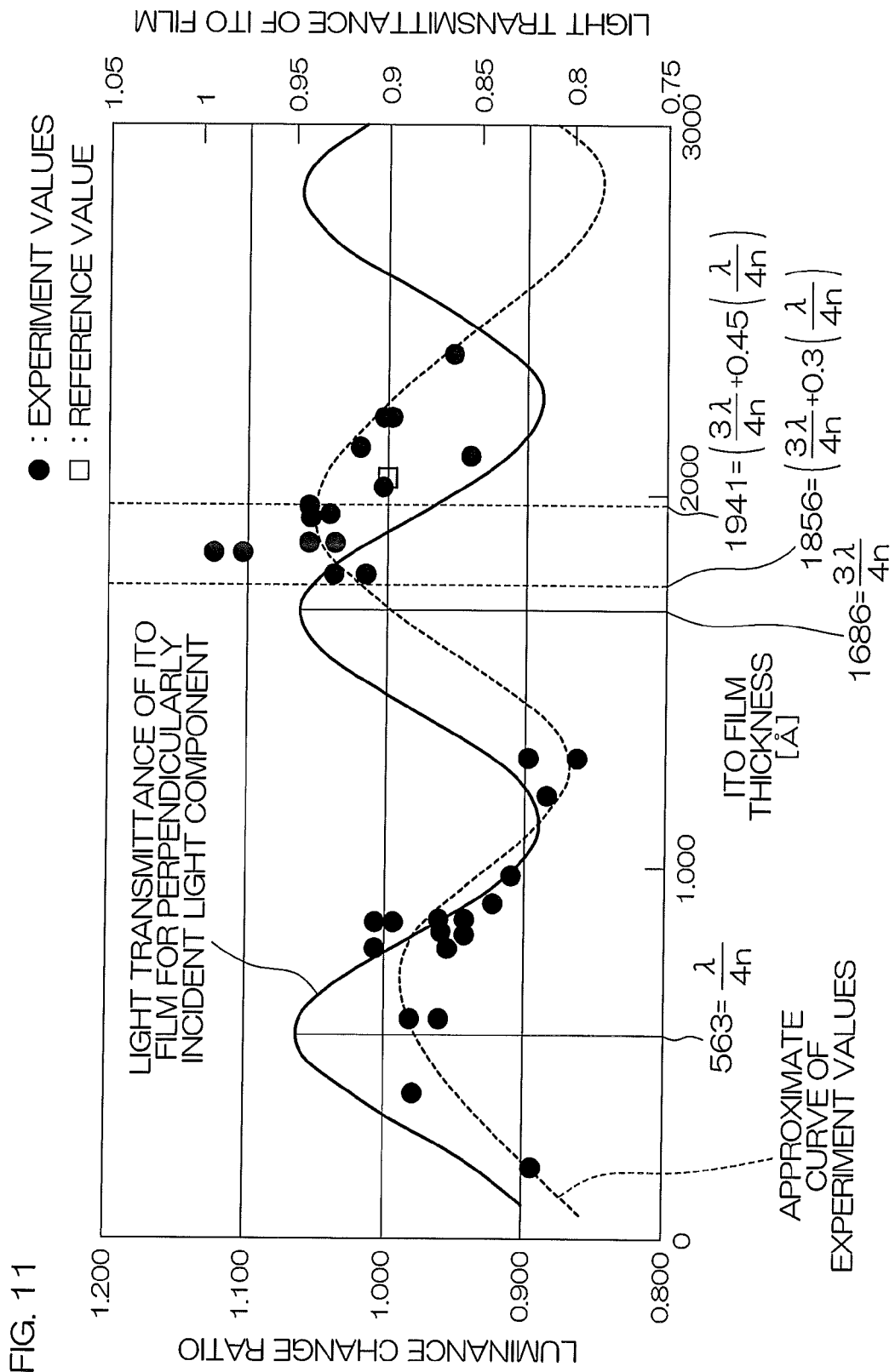
FIG. 11 is a graph showing a relationship between the luminance change ratio of the light-emitting element and the thickness of an ITO film.

FIG. 11 is a graph showing a relationship between the luminance change ratio of the light-emitting element and the thickness of an ITO film.

Light-emitting elements (each employing an ITO film as the transparent electrode layer 6 and GaN films as the nitride semiconductor layers) having the same construction as the light-emitting element 1 shown in FIG. 1 were produced, and it was checked how luminance observed when light was emitted from the light-emitting layer at a light-emitting wavelength $\lambda$ of 450 nm was changed with respect to the thickness of the ITO film (ITO film thickness).

Luminance observed when the ITO film thickness was 2050 Å was used as a reference luminance value (1.000 under reference conditions) by way of example, and the change ratio of an experiment luminance value relative to the reference luminance value was determined for evaluation. For example, a luminance change ratio of 1.100 indicates that the experiment luminance value was 10% greater than the reference luminance value.

FIG. 11 indicates that, when the ITO film thickness T satisfies the above expression (1), the experiment luminance value is 2% to 13% greater than the reference luminance value. Experiment values providing such a luminance increasing effect are plotted to provide an approximate curve indicated by a broken line in FIG. 11.

The approximate curve is phase-shifted in an ITO film thickness increasing direction with respect to a curve (indicated by a solid line in FIG. 11) showing a change in the light transmittance of the ITO film determined in consideration of only a light component incident perpendicularly on the ITO film. In the solid line curve, the luminance is increased as the light transmittance increases, because the multiple light reflection in the ITO film is reduced.

That is, where not only the perpendicular light component but also an oblique light component incident obliquely on the ITO film is taken into consideration, an optimum value of the ITO film thickness (at a vertex of the broken line curve) is shifted in the ITO film thickness increasing direction.

The description made with reference to FIG. 11 is directed to a case in which the light-emitting wavelength $\lambda$ is 450 nm, but the light-emitting wavelength $\lambda$ is not limited to 450 nm in the present invention.

The interface between the transparent electrode layer 6 and the reflective electrode layer 7 of the alloy containing silver, the platinum group metal and copper has a proper light reflecting ability, which is comparable to that of an interface between the reflective electrode layer 7 and an insulative layer (not shown) which may be provided between the transparent electrode layer 6 and the reflective electrode layer 7.

Since the reflective electrode layer 7 is provided on the transparent electrode layer 6 in contact with the transparent electrode layer 6, heat generated by the emission of the light from the light-emitting layer 4 is conducted directly to the reflective electrode layer 7 from the transparent electrode layer 6 to be thereby efficiently released from the reflective electrode layer 7 to the outside of the light-emitting element 1 (wiring element 20).

This further improves the heat releasing efficiency and the light extracting efficiency.

The reflective electrode layer 7 is provided in the same pattern as the transparent electrode layer 6 on the transparent electrode layer 6, and the entire back surface 7A of the reflective electrode layer 7 opposed to the transparent electrode layer 6 is kept in contact with the front surface 6B of the transparent electrode layer 6. Therefore, the back surface 7A of the reflective electrode layer 7 and the front surface 6B of the transparent electrode layer 6 completely overlap each other, so that the reflective electrode layer 7 and the transparent electrode layer 6 are free from irregularities which may otherwise occur due to non-overlapping portions thereof.

Thus, the light emitted from the light-emitting layer 4 and passing through the transparent electrode layer 6 can be efficiently reflected on the interface between the transparent electrode layer 6 and the reflective electrode layer 7 to be extracted without hindrance by the irregularities. The reflective electrode layer 7 and the transparent electrode layer 6 have the same pattern as seen in the stacking direction, so that the interface between the transparent electrode layer 6 and the reflective electrode layer 7 has the greatest possible area. Thus, the light passing through the transparent electrode layer 6 can be efficiently reflected on the interface. This further improves the light extracting efficiency.

In the absence of the irregularities described above, the connection surface of the light-emitting element 1 to be connected to the external wiring element 20 (the front surfaces 10B of the connection layers 10) is flat, and a connection area between the light-emitting element 1 and the wiring element 20 can be increased. The connection area herein means the area of connection between the front surfaces 10B of the connection layers 10 and the front surfaces 24A of the connection layers 24 of the wiring element 20 (see FIG. 9). With the increased connection area, the efficiency of heat release from the light-emitting element 1 to the wiring element 20 can be improved.

Further, no insulative layer is provided between the transparent electrode layer 6 and the reflective electrode layer 7. Even without the provision of the insulative layer, the reflective electrode layer 7 of the aforementioned alloy permits proper light reflection on the interface between the transparent electrode layer 6 and the reflective electrode layer 7. In the absence of the insulative layer, reduction in heat release efficiency and light extracting efficiency can be prevent which may otherwise occur due to the presence of the insulative layer.

Since the plurality of projections 11 are provided on the front surface 2B of the substrate 2, the light traveling from the n-type nitride semiconductor layer 3 toward the substrate 2 is substantially prevented from being reflected on the front surface 2B of the substrate 2 toward the n-type nitride semiconductor layer 3. This correspondingly improves the light extracting efficiency.

While the embodiment of the present invention has thus been described, the invention may be embodied in other ways.

For example, the transparent electrode layer 6 may have a layered structure including a first electrode sublayer 61 provided on the p-type nitride semiconductor layer in contact with the p-type nitride semiconductor layer 5 and having a first thickness $t_1$, and a second electrode sublayer 62 provided on the first electrode sublayer 61 and having a second thickness $t_2$ greater than the first thickness $t_1$. The first thickness $t_1$ is, for example, 5 Å to 500 Å, and the second thickness $t_2$ is, for example, 1400 Å to 1900 Å. The first electrode sublayer 61 has a light absorbance of, for example, 0 to 5% (at a light-emitting wavelength of 450 nm), and the second electrode layer 62 has a light absorbance of, for example, 0 to 2% (at a light-emitting wavelength of 450 nm).

When the transparent electrode layer 6 is formed as having the structure shown in FIG. 12 (in the step shown in FIG. 5D), the first electrode sublayer 61 is formed by deposition at a lower energy level, whereby a damage to the p-type nitride semiconductor layer 5 is reduced. In addition, the overall thickness T of the transparent electrode layer 6 may be adjusted by forming the first electrode sublayer 61 to the smaller thickness t; and then forming the second electrode sublayer 62 by deposition at a higher energy level, thereby improving the quality of the overall transparent electrode layer 6.

The material for the reflective electrode layer 7 is not limited to the alloy containing silver, the platinum group metal and copper, but other examples of the material include silver (Ag) and Rh (rhodium).

The reflective electrode layer 7 is not necessarily required to be kept in direct contact with the transparent electrode layer 6, but an insulative layer, for example, may be provided between the reflective electrode layer 7 and the transparent electrode layer 6.

It should be understood that the embodiment of the present invention is merely illustrative of the technical principles of the invention but not limitative of the invention. The spirit and scope of the present invention are to be limited only by the appended claims.

What is claimed is:

1. A light-emitting element having a front surface and a back surface and adapted to extract light from the back surface with the front surface facing down, the light-emitting element comprising:
   a substrate transparent to a light-emitting wavelength and defining the back surface;
   an n-type nitride semiconductor layer provided on the substrate;
   a light-emitting layer which is provided on the n-type nitride semiconductor layer and emits light at the light-emitting wavelength;
   a p-type nitride semiconductor layer provided on the light-emitting layer;
   a transparent electrode layer which is provided on the p-type nitride semiconductor layer and is transparent to the light-emitting wavelength of the light-emitting layer; and
   a reflective electrode layer which is provided on the transparent electrode layer and reflects light passing through the transparent electrode layer toward the back surface;
   wherein the transparent electrode layer includes a first electrode sublayer provided on the p-type nitride semiconductor layer and a second electrode sublayer provided on the first electrode sublayer, further wherein the transparent electrode layer has a thickness T satisfying a following expression (1):

$$\frac{3\lambda}{4n} + 0.30 \times \left(\frac{\lambda}{4n}\right) \le T \le \frac{3\lambda}{4n} + 0.45 \times \left(\frac{\lambda}{4n}\right) \quad (1)$$

wherein in expression (1), $\lambda$ is the light-emitting wavelength of the light-emitting layer, and n is a refractive index of the transparent electrode layer.

2. The light-emitting element according to claim 1, wherein the first electrode sublayer has a first thickness $t_1$, and the second electrode sublayer has a second thickness $t_2$ that is larger than the first thickness $t_1$.

3. The light-emitting element according to claim 2, wherein the first thickness $t_1$ is set to 5 Å to 500 Å and the second thickness $t_2$ is set to 1400 Å to 1900 Å.

4. The light-emitting element according to claim 1, wherein the first electrode sublayer and the second electrode sublayer have different light absorbances.

5. The light-emitting element according to claim 1, wherein the transparent electrode layer comprises one selected from the group consisting of ITO and ZnO.

6. The light-emitting element according to claim 1, wherein the light-emitting wavelength is 450 nm.

7. The light-emitting element according to claim 1, wherein the reflective electrode layer comprises an alloy comprising silver, a platinum group metal and copper, and is provided on the transparent electrode layer in contact with the transparent electrode layer.

8. The light-emitting element according to claim 7, wherein the reflective electrode layer is provided in a same pattern as the transparent electrode layer on the transparent electrode layer, and a surface of the reflective electrode layer opposed to the transparent electrode layer is entirely kept in contact with the transparent electrode layer.

9. The light-emitting element according to claim 8, wherein no insulative layer is provided between the transparent electrode layer and the reflective electrode layer.

10. The light-emitting element according to claim 7, wherein the platinum group metal is platinum.

11. The light-emitting element according to claim 7, wherein the platinum group metal is palladium.

12. The light-emitting element according to claim 1, wherein the substrate comprises one selected from the group consisting of sapphire, GaN and SiC.

13. The light-emitting element according to claim 1, wherein the substrate has a plurality of projections provided on a contact surface thereof kept in contact with the n-type nitride semiconductor layer.

14. The light-emitting element according to claim 13, wherein the projections are discretely arranged.

15. The light-emitting element according to claim 14, wherein the projections are arranged in a matrix array.

16. The light-emitting element according to claim 15, wherein the projections are arranged in staggered relation.

17. The light-emitting element according to claim 1, wherein the light-emitting layer comprises In.

18. The light-emitting element according to claim 1, further comprising a connection layer which comprises one selected from the group consisting of silver, solder and AuSn, and wherein the connection layer is provided on the reflective electrode layer.

19. A light-emitting element unit comprising:

a wiring element having a front surface and a back surface; and the light-emitting element according to claim 18, the light-emitting element being connected to the wiring element with the connection layer of the light-emitting element facing down.

20. The light-emitting element unit according to claim 19, wherein the light-emitting element further comprises an n-type electrode layer which connects the wiring element to the n-type nitride semiconductor layer.

21. The light-emitting element unit according to claim 20, wherein the light-emitting element further comprises an isolation insulative layer which isolates and insulates the n-type electrode layer and the reflective electrode layer from each other.

22. A light-emitting element package comprising:

the light-emitting element unit according to claim 19; and a resin package encapsulating the light-emitting element unit.

* * * * *